United States Patent [19]

Biswas et al.

[11] Patent Number: 4,518,628

[45] Date of Patent: May 21, 1985

[54] HERMETIC COATING BY HETEROGENEOUS NUCLEATION THERMOCHEMICAL DEPOSITION

[75] Inventors: Dipak R. Biswas; Dilip K. Nath, both of Roanoke, Va.

[73] Assignee: International Telephone and Telegraph Corporation, New York, N.Y.

[21] Appl. No.: 580,280

[22] Filed: Feb. 17, 1984

Related U.S. Application Data

[63] Continuation of Ser. No. 382,856, May 28, 1982, abandoned.

[51] Int. Cl.$^3$ .................... B05D 3/06; B05D 5/06; C23C 13/08; D04B 5/00
[52] U.S. Cl. .................... 427/55; 118/50.1; 118/641; 65/3.31; 65/11.1; 427/163; 427/255
[58] Field of Search .................... 65/3.31, 11.1; 118/50.1, 641; 427/55, 126.2, 163, 252, 253, 255

[56] References Cited

U.S. PATENT DOCUMENTS 3,859,126  1/1975  Dietz et al. .................... 428/446 X
4,118,211 10/1978  Au Coin et al. .................... 427/163 X
4,321,073  3/1982  Blair .................... 427/126.2 X

OTHER PUBLICATIONS

Pinnow, D. A. et al., *Hermetically Sealed High Strength Fiber Optical Waveguides*, The Transactions of the IECE of Japan, vol. E61, No. 3, Mar. 1978.

*Primary Examiner*—Michael R. Lusignan
*Attorney, Agent, or Firm*—John T. O'Halloran; Peter R. Ruzek

[57] ABSTRACT

An optical fiber which has just been drawn from an optical preform is provided with an external hermetic coating by using a heterogeneous nucleation thermochemical deposition technique. This technique involves passing the fiber through a reaction zone which contains a gaseous medium that includes a reactant which decomposes, or a mixture of reactants which chemically react, at a predetermined temperature to form the material of the coating. Only the fiber but not the gaseous medium surrounding the same is heated to the predetermined temperature, especially by directing radiation onto the exposed circumferential surface of the fiber, so that the decomposition or the chemical reaction takes place directly on the exposed surface of the fiber rather than in the gaseous medium, accompanied by simultaneous deposition of the coating material on the exposed surface of the fiber. The resulting fiber with hermetic coating can then be provided with an additional polymer coating layer. The apparatus for performing this technique includes a reactor including a transparent wall which circumferentially bounds a reaction chamber constituting the reaction zone, and a heating arrangement including two infrared radiation sources located externally of the transparent wall and each associated with a part-elliptical mirror which reflects the radiation toward the transparent wall and through the same onto the exposed surface of the fiber.

23 Claims, 3 Drawing Figures

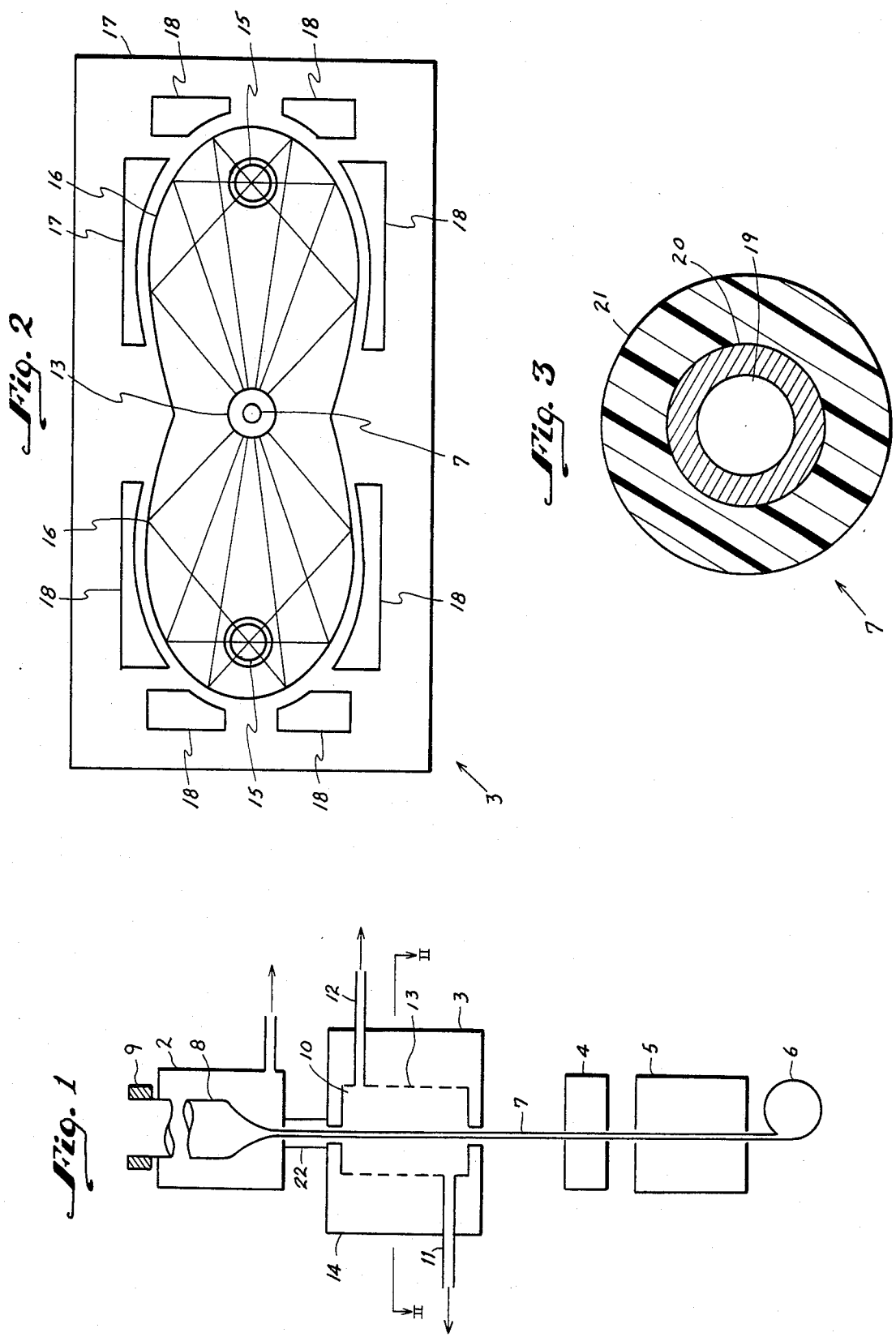

HERMETIC COATING BY HETEROGENEOUS NUCLEATION THERMOCHEMICAL DEPOSITION

This application is a continuation of application Ser. No. 382,856, filed May 28, 1982, now abandoned.

BACKGROUND OF THE INVENTION

This invention relates in general to a method of coating an optical fiber, and in particular to such a method that is carried out immediately after the fiber is drawn and that results in maintaining the mechanical strength of the optical fiber after the fiber has been drawn and especially during its storage and use.

Typical tensile strengths observed for the material of silicon oxide optical fibers at the time the fibers are drawn under ideal conditions are on the order of 1 million p.s.i. In certain optical communications, it is necessary to employ optical fibers having lengths above 1 kilometer. The problem in the art when using such long lengths of optical fibers has been the lack of adequate mechanical strength of the fiber as such. That is, the tensile strength of long lengths of commercially available optical fibers is in the range of 50,000 to 80,000 p.s.i. A mechanical strength above 200,000 p.s.i., however, is needed for optical fibers when used as optical waveguides in certain specialized applications, as for example, in rapid payout communication systems employing long lengths of fiber.

One reason why long lengths of fibers have not previously been prepared with sufficient mechanical strength was the presence of submicron surface flaws caused either by light mechanical abrasion during and after the usual fiber drawing operation and/or by chemical attack by atmospheric contaminants such as moisture. Attempts to solve these problems have been made by applying organic coatings to these fibers after the fibers have been drawn. However, these organic coatings have not been impervious to moisture or hydroxyl ion diffusion. This has led to the reduced strength of organic coated fibers during periods of use or storage. Optical glass fiber is very susceptible to moisture and many hostile environments. Therefore, the fiber needs a hermetic coating to protect its structural integrity.

One of the most feasible methods currently used for coating glass fibers with inorganic materials, such as silicon or various metals, is by chemical vapor deposition (CVD).

In chemical vapor deposition, the material of the coating is formed in a gaseous state, either by releasing the material of the coating from a single gaseous reactant at a temperature needed for releasing such a material, or by reacting at least two gaseous reactants with one another at the required reaction temperature. The material of the coating forms particles in the gaseous medium in which the release or the chemical formation of such material takes place. These particles are then deposited on the exposed surface of the fiber.

This approach has an inherent disadvantage in that the CVD reaction products (mostly solid particles) can interact with the substrate surface, that is, with the exposed surface of the fiber, to produce surface damage during the deposition process. Experience has shown that CVD usually produces large grains or growth cones which can produce substantial flaws in the fiber to cause degradation in strength of the fiber, by creating fissures or microcracks in the material of the fiber.

Thus, when this method of coating is used, the strength of unit length of the fiber is reduced below that which the unit length had immediately after the drawing of the fiber or the fiber core and prior to the application of the hermetic coating to the core in the chemical vapor deposition process. While this degradation in strength may not affect each unit length, it occurs often enough for the overall strength of the substantial length of the hermetically coated fiber to be considerably reduced relative to the strength which the material of the fiber had immediately after drawing. This, of course, is very disadvantageous.

SUMMARY OF THE INVENTION

Accordingly, it is a general object of the present invention to avoid the disadvantages of the prior art.

More particularly, it is an object of the present invention to develop a method of depositing a hermetic coating on the exposed surface of a glass fiber, especially immediately after such fiber has been drawn from an optical preform, which method does not possess the disadvantages of the conventional methods and does not result in deterioration of the strength of the fiber.

Another object of the invention is to provide a method of manufacturing a coated high-strength optical fiber of an increased durability as compared to conventional coated optical fibers.

A concomitant object of the present invention is to devise an apparatus suited for performing the above mentioned methods.

It is still another object of the present invention to so construct the apparatus of the type here under consideration as to be simple in construction, inexpensive to manufacture, and reliable in operation nevertheless.

An additional object of the present invention is to so design the apparatus of the above type as to be capable of depositing a hermetic coating on the fiber without reducing the mechanical strength of such fiber.

In pursuance of these objects and others which will become apparent hereafter, one feature of the present invention resides in a method of applying a hermetic coating to an exposed surface of an optical fiber, comprising the steps of passing the fiber through a gaseous medium containing at least one reactant capable of undergoing a chemical conversion into the material of the coating when heated to a predetermined temperature; and heating the optical fiber at least at its exposed surface at least to the predetermined temperature for the chemical conversion into and simultaneous deposition of the material of the coating to take place directly on the exposed surface. Advantageously, the hermetic coating is applied to the optical fiber immediately after the drawing of the fiber from an optical preform, and the passing and heating steps are conducted at the same region.

The method of the present invention advantageously further comprises the step of circulating the gaseous medium around the heated exposed surface of the fiber. This circulating step may include confining the gaseous medium in a reaction zone, and admitting replenishment gaseous medium containing the reactant into the reaction zone. This may be accomplished by directing at least one stream of the gaseous medium against the heated exposed surface of the fiber. The heating step may include directing radiation, especially infrared radiation, against the exposed surface.

According to another aspect of the present invention, there is provided a method of producing a high-strength optical fiber having a hermetic coating on its core, comprising the steps of drawing the core from an optical preform; passing the just drawn core through a gaseous medium containing at least one reactant capable of undergoing a chemical conversion into the material of the coating when heated to a predetermined temperature; and heating the core at least at its exposed surface at least to the predetermined temperature for the chemical conversion into and simultaneous deposition of the material of the coating to take place directly on the exposed surface. This method may then further include the step of applying an additional coating layer to the external surface of the hermetic coating. These methods may also involve the step of introducing into the gaseous medium at least two reactants capable of interacting at the predetermined temperature to form the material of the coating, instead of the above-discussed single reactant.

According to another concept of the present invention, there is provided an apparatus for applying a hermetic coating to an exposed surface of an optical fiber, comprising means for defining a reaction zone; means for maintaining in the reaction zone a body of a gaseous medium containing at least one reactant capable of undergoing a chemical conversion into the material of the coating when heated to a predetermined temperature; and means for heating the optical fiber at least at its exposed surface at least to the predetermined temperature for the chemical conversion into and simultaneous deposition of the material of the coating to take place directly on the exposed surface. The heating means of such an apparatus advantageously includes means for directing radiation onto the exposed surface of the fiber, especially at least one elongated radiation source extending substantially parallel to the fiber. The directing means advantageously includes at least one infrared radiation source.

In a currently preferred construction of the apparatus, the defining means includes at least one wall portion which circumferentially surrounds the reaction zone and which is transparent to heat radiation. Then, the directing means advantageously includes at least one source of the radiation disposed externally of the wall portion and aimed through the latter at the exposed surface of the fiber passing through the reaction zone. To achieve maximum utilization of the energy emitted by the radiation source and to heat the fiber as uniformly as possible, it is advantageous when the directing means further includes at least one reflecting member partially surrounding the source and operative for reflecting the radiation emitted by the source and reaching the reflecting member toward the wall portion and through the same onto the exposed surface of the fiber passing through the reaction zone.

The maintaining means advantageously includes means for admitting at least the one reactant into the reaction zone to replenish the amount of the one reactant in the body or means for admitting into the reaction zone at least two such reactants which are capable of interreacting at the predetermined temperature to form the material of the coating, to replenish the amounts of such reactants in the body.

The present invention also relates to an apparatus for producing a high-strength optical fiber having a hermetic coating on its core, this apparatus comprising means for defining a reaction zone; means for maintaining in the reaction zone a body of a gaseous medium containing at least one reactant capable of undergoing a chemical conversion into the material of the coating when heated to a predetermined temperature; means for drawing the core from an optical preform and for passing such core immediately after drawing through the reaction zone; and means for heating the core passing through the reaction zone at least at its exposed surface at least to the predetermined temperature for the chemical conversion into and simultaneous deposition of the material of the coating to take place directly on the exposed surface. This apparatus may then advantageously further comprise means for applying at least one layer of additional coating to the external surface of the hermetic coating after the emergence thereof from the reaction zone.

The above discussed method of applying the hermetic coating will hereafter be referred to as heterogeneous nucleation thermochemical deposition (HNTD). This is a process of coating in which the deposits are produced by heterogeneous chemical reactions directly at the heated substrate surface rather than in the atmosphere surrounding the fiber. A volatile compound of the element or substance to be deposited is vaporized, and the vapor thermally decomposed or reacted with other vapors at the heated substrate surface to yield non-volatile reaction products as a coating onto the substrate. The HNTD process can be carried out at a low temperature or at a high temperature depending upon the coating and the reactants.

The HNTD method is distinctively different from the chemical vapor deposition, as CVD is a homogeneous chemical reaction process in which the reaction products are mainly formed in the vapor phase. In contrast, the HNTD process produces a fine grained structure directly at the substrate and avoids the growth cones completely. There is no interaction of solid particles with the substrate surface to produce surface damage.

The coating materials
Should have good adhesion or bonding with the substrate material
Should have a thermal expansion coefficient comparable to that of the substrate material to minimize thermal stresses and
Should be corrosion resistant to the environment in which the fiber is intended to be used.

Preferred coating materials are metals/alloys, glass and ceramics. The substrate materials are glass, ceramics, and metals. The raw gaseous materials are mainly metal halides, such as silicon halides, oxyhalides, hydrides, carbonyls, organometallics and metal organics along with other reactant gases and carrier gases.

BRIEF DESCRIPTION OF THE DRAWINGS

Above-mentioned and other features and objects of this invention will become more apparent by reference to the following description taken in conjunction with the accompanying drawing, in which:

FIG. 1 is a diagrammatic side elevational view an apparatus according to the present invention for producing a coated optical fiber;

FIG. 2 is a diagrammatic sectional view of the apparatus according to the present invention taken on line II—II or FIG. 1, on an enlarged scale; and FIG. 3 is a substantially enlarged transverse sectional view of a coated fiber as produced by the apparatus of FIG. 1.

DETAILED DESCRIPTION OF THE PREFERRED EMBODIMENTS

Referring now to the drawing in detail, and first to FIG. 1 thereof, it may be seen that the reference numeral 1 has been used to identify an apparatus for producing a coated optical fiber in its entirety. The apparatus 1 includes, as its main components, a fiber preform draw furnace 2, a reactor 3, a polymer coater 4, a curing oven 5, and a drawing arrangement 6. The drawing arrangement 6 is diagrammatically illustrated as a spool. The drawing arrangement 6 draws, in a conventional manner, a fiber 7 from a preform 8 which is mounted in a chuck 9 and which extends into the fiber preform draw furnace 2. The chuck 9 may rotate the preform 8 during the drawing operation, if necessary or advantageous. The portion of the preform 8 which is received in the draw furnace 2 is heated in a conventional manner, such as by hot gases, an oxyhydrogen flame, a plasma flame, or by a radiation. The particular method which is used for heating the preform 8 is of no consequence in the context of the present invention.

What is important is that, immediately after leaving the draw furnace 2 and in any event before the freshly drawn exposed surface of the fiber 7 has suffered any damage, the fiber 7 enters the interior of the reactor 3. The reactor 3 bounds an internal chamber 10 into which a reactant gas is admitted through an inlet port 11 and from which the spent reactant gas is discharged through an outlet port 12. As mentioned before, and as will be discussed in detail later on, the reactant gas consists of or contains at least one reactant or substance which, when heated to predetermined temperature, releases the material of the hermetic coating which is to be applied to the exterior of the fiber 7 in the reaction chamber 10. It may be seen that the reactant gas passes through the chamber 10 in counterflow to the advancement of the fiber 7 through the chamber 10. The reaction chamber 10 is circumferentially surrounded by a transparent window 13. A heating assembly 14 is arranged at the exterior of the transparent window 13 and is operative for directing radiation, especially infrared radiation, against the exposed surface of the fiber 7 as the latter passes through the reaction chamber 10. The transparent window 13 need not be transparent to all kinds of radiation, but it must be transparent to the radiation which is used for heating the external exposed surface of the fiber 7. Further details of the construction of the heating assembly 14 will be discussed below in connection with FIG. 2.

Referring still to FIG. 1 it may be seen that the fiber 7, which has acquired hermetic coating in the reaction chamber 10 is conducted through the interior of the polymer coater 4 after emerging from the reactor 3. The polymer coater 4 is of a conventional construction so that no details thereof need be discussed here. Suffice it to say that at least one additional layer of coating, especially of polymer coating, is applied on top of the aforementioned hermetic coating produced in the reaction chamber 10 of the reactor 3. After this polymer coating has been applied, the fiber 7 passes through the curing oven 5 where the polymer coating is cured, especially by applying heat thereto, to give such a coating the desired properties. Even the construction of the curing oven 5 is conventional and will not be described here. Finally, the now coated fiber 7 reaches the drawing arrangement or spool 6 to be wound thereon for at least temporary storage purposes.

Further details of the reactor 3 are shown in FIG. 2. The heating assembly 14 is shown to include two elongated heating elements or sources 15 which extend substantially parallel to the direction of advancement of the fiber 7. The elongated heating sources 15 are situated at the respective foci of associated substantially elliptical mirrors 16, while the fiber 7 passes through the other focus. The reactor 3 includes a housing 17, and the mirrors 16 may be directly applied or connected to the internal surface of the housing 17 which bounds a cavity for the heating sources 15. The heating sources 15 emit radiation, especially infrared radiation, which is either directly aimed at or reflected by the mirrors 16 toward the transparent window or wall portion 13 and through the same onto or toward the drawn fiber 7, as diagramatically illustrated by respective lines indicating the trajectories of selected rays of the radiation. The housing 17 includes a plurality of compartments or ducts 18 through which a cooling medium, such as water, is circulated to cool the housing 17 at the region of the mirrors 16.

As may be seen in FIG. 3, the fiber 7 in its final condition existing after it has emerged from the curing oven 5 (see FIG. 1) includes a core 19 of an optic material, such as glass or the like, a hermetic layer 20 produced by the HNTD process of the present invention in the reactor 3, and an outer coating 21 of organic material which is produced in the coating arrangement 4 and cured in the curing arrangement 5.

In conventional fiber drawing, when the fiber is drawn from a solid preform, it passes through a polymer coater to preserve the fiber pristine surface and for handling ease. Thus, the hermetic coating by HNTD process has to be carried out in between the drawing zone 2 and the polymer coater 4. With the help of the heating assembly 14, only the fiber 7 gets heated to a desired temperature for the heterogeneous chemical reaction for deposition within the reaction chamber or zone 10. This reaction temperature is referred to as the "heterogeneous chemical reaction temperature." The temperature at the wall of the transparent window 13 will be lower than that of the fiber surface. Therefore, no chemical reaction products will be deposited on the inside of the wall surface. Low temperature and high temperature reaction conditions for hermetic coating onto a glass fiber (on line) are shown in the following Table 1. Only a few examples of metals and ceramic coating materials are listed in Table 1.

TABLE 1

| Coating Material | Reactant(s) | Type of Reaction | Reaction Temperature °C. | Reaction Environments |
|---|---|---|---|---|
| Al | Triisobutyl Aluminum and Isobutylene | Decomposition | 260 | |
| Ni | Nickel Carbonyl | Decomposition | 200 | $NH_3$, $CO_2$, $H_2$ and $H_2S$ |
| Si | Silicon Tetrachloride and Hydrogen | Hydrogen Reduction | 1200 | $H_2$ |
| Ti | Titanium Iodide | Decomposition | 1200–1400 | Ar, He |
| $Si_3N_4$ | Silane and Ammonia | Vapor Phase Reaction | 600–1000 | $H_2$ |
| $SnO_2$ | Tin Tetra- | Oxidation | 873 | |

TABLE 1-continued

| Reacting Conditions of HNTD Materials | | | | |
|---|---|---|---|---|
| Coating Material | Reactant(s) | Type of Reaction | Reaction Temperature °C. | Reaction Environments |
| BN | chloride and Oxygen Diborane and Ammonia | Vapor Phase Reaction | 400–700 | |
| TiO$_2$ | Titanium Tetrachloride and Oxygen | Oxidation | >1000 | |

The vapor of the volatile metal compounds constituting the reactants is generated by evaporation. This evaporation may be accomplished either by heating a volatile compound or by passing a non-reactive gas over or through the volatile compound and reacting into metal immediately at the surface of the fiber 7 with simultaneous deposit. Any volatile byproducts must be transported away through the exhaust 12.

Deposition parameters are gas flow rates, pressure and temperature. An increase in concentration of reactive gas or substrate temperature increases the deposition rates. Increasing substrate temperatures or decreasing reactive gas concentration increases the crystallinity of the film or coating 20. Impurities affect film growth by modifying the nucleation rate and by causing structural defects. Carbon contamination, for example, during the deposition of silicon may cause stacking faults and whiskers and impede step motion.

The film should firmly adhere to the glass and should not produce any surface damage to the surface of the fiber. The thermal expansion mismatch between the metal such as silicons, film or coating 20 and the glass fiber core 19 should not produce sufficient stresses to cause failure at the film-fiber interface.

As mentioned before, the freshly drawn fiber 7 must be provided with the hermetic coating 20 prior to suffering any appreciable damage due to environmental influences. To achieve this, the draw furnace 2 and the reactor 3 may either be situated directly above one another or form a structural unit by having a common housing or, as shown in FIG. 1, a tubular shielding element 22 may be interposed between the draw furnace 2 and the reactor 3. The fiber 7 then passes through the interior of the shielding element 22 and is thus protected from environmental influences. A particular advantage of this latter approach is that the shielding element 22 may be provided with a diameter control window to permit constant or intermittent supervision of the drawing operation.

While we have described above the principles of our invention in connection with the specific apparatus, it is to be clearly understood that this description is made only by way of example and not as a limitation to the scope of our invention as set forth in the accompanying claims.

We claim:

1. A method of applying a hermetic coating to an exposed surface of an optical fiber, comprising the steps of
    passing the fiber through a gaseous medium containing at least one reactant capable of undergoing a chemical conversion into the material of the coating when heated to a predetermined temperature; and
    directing infrared radiation from all radial directions against the optical fiber to heat the same at least at its exposed surface at least to the predetermined temperature for the chemical conversion into and simultaneous deposition of the material of the coating to take place directly on the exposed surface, including omnidirectionally issuing the infrared radiation, and reflecting at least a part of the issued infrared radiation which would otherwise not reach the optical fiber onto the exposed surface of the optical fiber for such reflected infrared radiation to reach the exposed surface from radial directions angularly spaced from the direction of direct travel of the infrared radiation.

2. The method as defined in claim 1, wherein
    the hermetic coating is applied to the optical fiber immediately after the drawing of the fiber from an optical preform.

3. The method as defined in claim 1, wherein
    said passing and directing steps are conducted at the same region.

4. The method as defined in claim 1; and further comprising
    the step of circulating the gaseous medium around the the heated exposed surface of the fiber.

5. The method as defined in claim 4, wherein
    said circulating step includes confining the gaseous medium in a reaction zone, and admitting replenishment gaseous medium containing the reactant into the reaction zone.

6. The method as defined in claim 4, wherein
    said circulating step includes directing at least one stream of the gaseous medium against the heated exposed surface of the fiber.

7. A method of producing a high-strength optical fiber having a hermetic coating on its core, comprising the steps of
    drawing the core from an optical preform;
    passing the just drawn core through a gaseous medium containing at least one reactant capable of undergoing a chemical conversion into the material of the coating when heated to the predetermined temperature; and
    directing infrared radiation from all radial directions against the core to heat the same at least at its exposed surface at least to the predetermined temperature for the chemical conversion into and simultaneous deposition of the material of the coating to take place directly on the exposed surface, including omnidirectionally issuing the infrared radiation, and reflecting at least a part of the issued infrared radiation which would otherwise not reach the optical fiber onto the exposed surface of the optical fiber for such reflected infrared radiation to reach the exposed surface from radial directions angularly spaced from the direction of direct travel of the infrared radiation.

8. The method as defined in claim 7, wherein
    said passing and directing steps are conducted at the same region.

9. The method as defined in claim 7; and further comprising
    the step of circulating the gaseous medium around the heated exposed surface of the fiber.

10. The method as defined in claim 9, wherein said circulating step includes confining the gaseous medium in a reaction zone, and admitting replenishment gaseous medium containing the reactant into the reaction zone.

11. The method as defined in claim 9, wherein said circulating step includes directing at least one stream of the gaseous medium against the heated exposed surface of the fiber.

12. The method as defined in claim 7; and further comprising the step of applying an additional coating layer to the external surface of the hermetic coating.

13. A method of applying a hermetic coating to an exposed surface of an optical fiber, comprising the steps of
forming a body of a gaseous medium containing at least one reactant capable of undergoing a chemical change into the material of the coating when heated to a predetermined temperature;
passing the fiber through the body of the gaseous medium; and
directing infrared radiation from all radial directions against the optical fiber to heat the same at least at its exposed surface at least to the predetermined temperature for the chemical conversion and simultaneous deposition of the material of the coating to take place directly on the exposed surface, including omnidirectionally issuing the infrared radiation, and reflecting at least a part of the issued infrared radiation which would otherwise not reach the optical fiber onto the exposed surface of the optical fiber for such reflected infrared radiation to reach the exposed surface from radial directions angularly spaced from the direction of direct travel of the infrared radiation.

14. The method as defined in claim 13, wherein said forming step includes introducing into the the body of the gaseous medium at least two reactants capable of interreacting at the predetermined temperature to form the material of the coating.

15. An apparatus for applying a hermetic coating to an exposed surface of an optical fiber, comprising
means for defining a reaction zone;
means for maintaining in the reaction zone a body of a gaseous medium containing at least one reactant capable of undergoing a chemical conversion into the material of the coating when heated to a predetermined temperature; and
means for directing infrared radiation from all radial directions against the optical fiber to heat the same at least at its exposed surface at least to the predetermined temperature for the chemical conversion into and simultaneous deposition of the material of the coating to take place directly on the exposed surface, including means for omnidirectionally issuing the infrared radiation, and means for reflecting at least part of the infrared radiation that would otherwise not reach the optical fiber onto the exposed surface of the optical fiber for the reflected infrared radiation to reach the exposed surface from radial directions angularly spaced from the direction of direct travel of the infrared radiation from the issuing means toward the optical fiber.

16. The apparatus as defined in claim 15, wherein said issuing means includes at least one infrared radiation source.

17. The apparatus as defined in claim 15, wherein said defining means includes at leat one wall portion which circumferentially surrounds said reaction zone and which is transparent to said radiation; and wherein
said issuing means includes at least one source of said radiation disposed externally of said wall portion and aimed through the latter at the exposed surface of the fiber passing through said reaction zone.

18. The apparatus as defined in claim 17, wherein said reflecting means includes at least one cross-sectionally elliptical reflecting member at least partially surrounding said source so as to have said source at one, and the reaction zone at the other, of its focal lines, and operative for reflecting the radiation emitted by said source and reaching said reflecting member toward said wall portion and through the same onto the exposed surface of the fiber passing through said reaction zone.

19. The apparatus as defined in claim 15, wherein said reflecting means includes at least one elongated radiation source extending substantially parallel to the fiber.

20. The apparatus as defined in claim 15, wherein said maintaining means includes means for admitting at least said one reactant into said reaction zone to replenish the amount of said one reactant in said body.

21. The apparatus as defined in claim 15, wherein said maintaining means includes means for admitting into said reaction zone at least two of said reactants which are capable of interreacting at said predetermined temperature to form the material of said coating, to replenish the amounts of such reactants in said body.

22. An apparatus for producing a high-strength optical fiber having a hermetic coating on its core, comprising
means for defining a reaction zone;
means for maintaining in said reaction zone a body of a gaseous medium containing at least one reactant capable of undergoing a chemical conversion into the material of the coating when heated to a predetermined temperature;
means for drawing the core from an optical preform and for passing such core immediately after drawing through said reaction zone; and
means for directing infrared radiation from all radial directions against the core passing through said reaction zone to heat the core at least at its exposed surface at least to said predetermined temperature for the chemical conversion into and simultaneous deposition of the material of the coating to take place directly on the exposed surface, including means for omnidirectionally issuing the infrared radiation, and means for reflecting at least a part of the infrared radiation that would otherwise not reach the optical fiber onto the exposed surface of the optical fiber for the reflected infrared radiation to reach the exposed surface from radial directions angularly spaced from the direction of direct travel of the infrared radiation from the issuing means toward the optical fiber.

23. The apparatus as defined in claim 22; and further comprising
means for applying at least one layer of additional coating to the external surface of the hermetic coating after the emergence thereof from said reaction zone.

* * * * *